United States Patent [19]

Talambiras

[11] 4,414,638
[45] Nov. 8, 1983

[54] SAMPLING NETWORK ANALYZER WITH STORED CORRECTION OF GAIN ERRORS

[75] Inventor: Robert P. Talambiras, Springfield, N.J.

[73] Assignee: Dranetz Engineering Laboratories, Inc., Edison, N.J.

[21] Appl. No.: 258,953

[22] Filed: Apr. 30, 1981

[51] Int. Cl.³ .......................... G06J 1/00; G06F 15/20
[52] U.S. Cl. .................................. 364/571; 364/481; 364/573
[58] Field of Search ................ 330/278, 132; 364/571, 364/573, 606

[56] References Cited

U.S. PATENT DOCUMENTS

| | | | |
|---|---|---|---|
| 3,790,910 | 2/1974 | McCormack | 364/558 |
| 4,031,630 | 6/1977 | Fowler | 364/571 X |
| 4,064,396 | 12/1977 | Panarello | 364/573 |
| 4,091,543 | 5/1978 | Lapeyre | 364/571 X |
| 4,149,120 | 4/1979 | Richter | 324/132 |
| 4,200,933 | 4/1980 | Nickel et al. | 364/571 |

Primary Examiner—Gareth D. Shaw
Assistant Examiner—Ronni S. Malamud
Attorney, Agent, or Firm—Richard C. Woodbridge

[57] ABSTRACT

An improved sampling network analyzer is described, in which a stored memory, for example, a programmable read-only memory (PROM), is utilized to store the discrepancies between various predetermined mid-band voltage gains and their desired, exact values, and to supply this correction information to the sampling network analyzer in order to produce a more accurate amplitude measure of the amplitude of voltages applied to the inputs of the sampling network analyzer. In addition, low- and high-frequency characteristic frequencies can be stored, and correction made for the gain-vs-frequency characteristic of an amplifier or amplifier chain. The correction factors are typically measured in final test of the sampling network analyzer, and programmed into a PROM that is incorporated into the particular sampling network analyzer. In subsequent operation, when the sampling network analyzer invokes a particular voltage gain, the corresponding gain correction factor is read out and utilized, by the instrument, to produce a more accurate representation of input voltage amplitude.

7 Claims, 2 Drawing Figures

SAMPLING NETWORK ANALYZER WITH STORED CORRECTION OF GAIN ERRORS

CROSS-REFERENCES TO RELATED APPLICATIONS

Applicant's related application, filed simultaneously with the present application, is entitled "Sampling Network Analyzer With Sampling Synchronization By Means of Phase-Locked Loop filed Apr. 30, 1981 and given Ser. No. 06/259,013.

BACKGROUND OF THE INVENTION

1. Field of the Invention

This invention relates to sampling network analyzers generally, and more particularly to sampling network analyzers which measure complex voltage, current, voltage or current ratio, phase angle, and power, including the contributions of harmonics of a fundamental Fourier component. Specifically, the present invention is directed to a such a sampling network analyzer in which there is included one or more controlled-gain amplifiers, where the voltage gain of such amplifiers may depart from their ideal, or exact, voltage gain. The invention is directed to an apparatus whereby the errors in mid-band voltage gain of such controlled-gain amplifiers are measured, typically in final test of the sampling network analyzer, and programmed into a programmable read-only memory (PROM). The PROM may also be programmed with measured values of the characteristic low-and-high-frequency cutoff values, to permit correction for the gain-vs-frequency characteristic of the amplifier or amplifier chain. The PROM becomes a part of the sampling network analyzer and, whenever a particular voltage gain of one of the controlled-gain amplifiers is invoked, at a particular frequency, the appropriate correction factor is made available to the instrument from the PROM.

2. Description of the Prior Art

The prior art includes several references directed to the concept of storing a correction signal in a memory for compensating various instrument response characteristics.

U.S. Pat. No. 4,149,120 decribes a stored program arrangement for correcting linearity of a test sensor.

U.S. Pat. No. 4,200,933 describes a microprocessor-controlled digital multimeter which includes self-calibration features, in addition to calibration constants.

U.S. Pat. No. 4,064,396, directed to a linearization system for a radiation gauge, includes a PROM which serves to store correction coefficients in the form of a set of digital signals.

SUMMARY OF THE INVENTION

The present invention is directed to an improved network analyzer of the type having a first input port means for receiving a first analog input signal, a first input amplifier means, characterized by a first voltage gain, for producing a first output signal that is related to the first analog input signal; and first autorange control circuit means for controlling the first voltage gain of the first input amplifier means so as to approximate one of a first set of predetermined voltage gains such that amplitude of the first output signal is within a first predetermined range of amplitudes. The improvement comprises a first gain correcting PROM means for providing a correction signal that takes into account the departure of mid-band first voltage gain of the first input amplifier means from the desired one of the first set of predetermined voltage gains. The PROM means may also provide a correction signal related to the gain-vs-frequency characteristic of the first input amplifier means.

An object of the present invention is to provide an improved network analyzer in which accuracy of the indicated measurement of voltages or currents applied to the input ports of such network analyzer is improved over the inherent accuracy of gain-determining components of the network analyzer, and with the possibility of correction for frequency-dependent characteristics as well.

BRIEF DESCRIPTION OF THE DRAWINGS

A complete understanding of the invention may be obtained from the detailed description which follows, together with the accompanying drawings, wherein.

DESCRIPTION OF THE INVENTION

Figure 1:
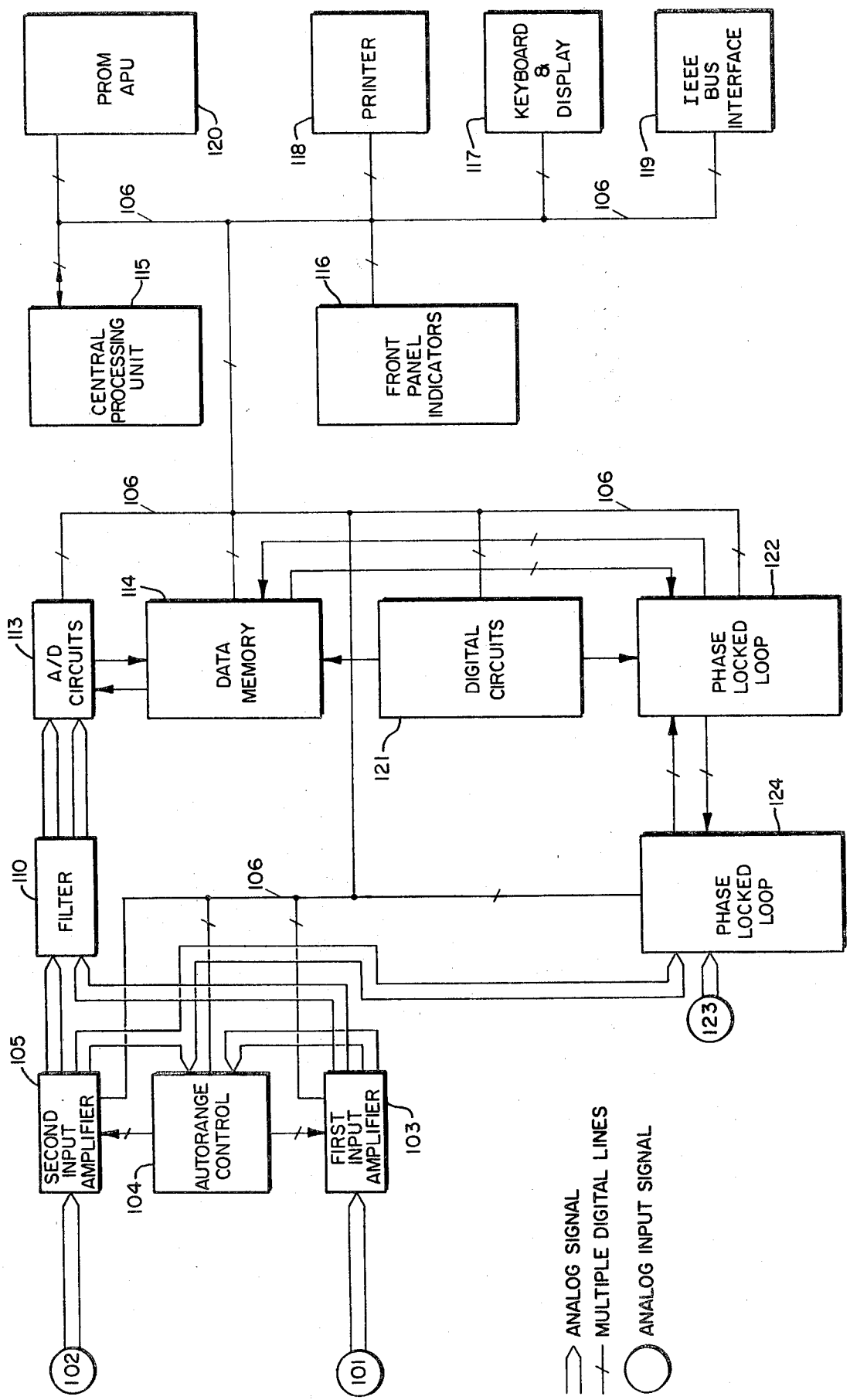
FIG. 1 is a generalized block diagram of a Sampling Network Analyzer according to the present invention.

The present invention may be understood by reference to the illustrative embodiment of FIG. 1. The Sampling Network Analyzer includes first analog input port 101 and second analog input port 102. First analog input port 101 is electrically connected to first input amplifier 103, and second analog input port 102 is electrically connected to second input amplifier 105. Input amplifiers 103 and 105 are variable gain amplifiers characterized by voltage gain (the ratio of output voltage amplitude to the voltage amplitude of a signal applied to the corresponding input port and resulting in such output voltage amplitude) which can be controlled, or varied, by the autorange control circuits, designated 104 in FIG. 1.

It should be noted that autorange control circuits 104 are electrically connected to the analog outputs of first input amplifier 103 and second input amplifier 105. Autorange control circuits 104 operate or control the voltage gain of first input amplifier 103 and second input amplifier 105 so as to maintain within predetermined limits the amplitude of the signals appearing at the outputs of these amplifiers.

The analog output signals of first input amplifier 103 and second input amplifier 105 are applied to optional filtering means 110. Filtering means 110 serve to provide a controlled frequency-selective filter characteristic in the analog signal paths between input amplifiers 103, 105 and sample-and-hold, multiplexer, and analog-to-digital converter means 113. Usually filtering means 110 will comprise two independent filters, one in each signal path. The amplitude and phase characteristics of the two independent filters are preferably matched one to the other.

The outputs of filtering means 110 are applied to the block designated 113, which contains sample-and-hold, multiplexer, and analog-to-digital converter (ADC) means. The circuitry of 113 serves simultaneously to sample, and hold, the instantaneous output signals of filtering means 110 (or, if optional filtering means 110 are omitted, then the outputs of first input amplifier 103 and second input amplifier 105). The multiplexer portion of 113 selects one of the two sampled signals, and presents the selected sampled signal to an analog-to-digital converter, which serves to convert the signal into digital form. The internal arrangement of the circuitry of 113 is shown in greater detail in FIG. 2, and it will be described in greater detail in the discussion of FIG. 2.

Returning to FIG. 1, analog-to-digital control and data memory means 114 serve to control the sequence of operation of sample-and-hold, multiplexer, and ADC means 113.

The output of sample-and-hold, multiplexer and ADC means 113 is connected to a data bus 106, by means of which the central processing unit (CPU) 115 communicates, in either direction, with various portions of the sampling network analyzer, including sample-and-hold, multiplexer and ADC means 113. Note that central processing unit 115 communicates with data bus 106 in a bi-directional fashion, as is indicated in FIG. 1.

Central processing unit (CPU) 115 also communicates, via data bus 106, with numerous other portions of the sampling network analyzer, namely: autorange control circuits 104, phase-locked loop (PLL) analog circuit means 124, sample-and-hold, multiplexer, and ADC means 113, A/D control and data memory means 114, miscellaneous digital circuits 121, phase-locked-loop (PLL) digital circuits 122, programmable read-only-memory/arithmetic processor unit (PROM/APU) means 120, printer 118, keyboard and display 117, front panel indicators 116, and optional IEEE 488 bus interface means 119.

Phase-locked loop analog circuits 124, as can be seen from FIG. 1, are electrically connected to an external frequency reference input port 123 or the output of the second input amplifier 105. The external frequency reference input port may be supplied an external reference signal which serves to synchronize operation of the sampling network analyzer. Operation of the PLL analog circuits 124 and PLL digital circuits 122 will be described in greater detail in the discussion of FIG. 2.

Figure 2:
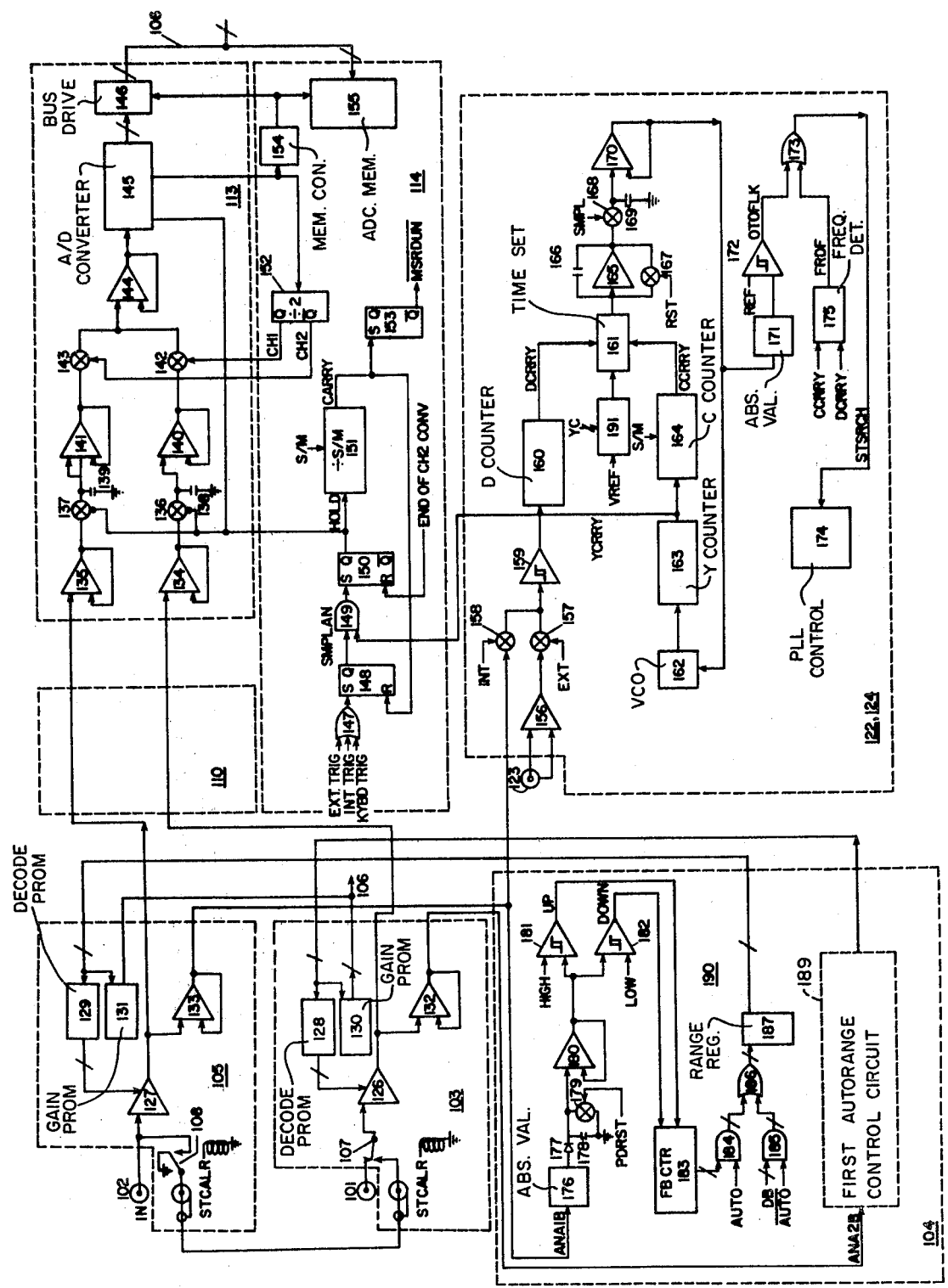
FIG. 2 is a block diagram illustrating, in greater detail than FIG. 1, those portions of the Sampling Network Analyzer that are most relevant to the present invention.

Referring now to FIG. 2, which shows in greater detail many of the components and interconnections depicted schematically in FIG. 1, there appears first analog input port 101 and second analog input port 102, which are connected, respectively, to first variable gain amplifier 126 and second variable gain amplifier 127. Note the first input amplifier 103, which appears as a single block in FIG. 1, is shown in FIG. 2, as comprising first variable gain amplifier 126, first gain decoding programmable-read-only memory (PROM) 128, first gain correcting programmable-read-only memory (PROM) 130, and first buffer amplifier 132. The first input signal, applied to first analog input port 101, is routed via first calibration relay 107 to the input of first variable-gain amplifier 126. The output of first variable-gain amplifier 126 is electrically connected to first buffer amplifier 132 and to filtering means 110. The output of first buffer amplifier 132 is supplied to the autorange control circuits 104 and, in particular, to the first autorange control circuit 189. First gain decoding PROM 128, which is electrically connected so as to control the voltage gain of first variable gain amplifier 126 is, in turn, controlled by first autorange control circuit 189, as can be seen from FIG. 2. First gain correcting PROM 130, which is also fed from first autorange control circuit 189, serves to provide a correction for any inaccuracy of the gain control characteristic of first variable-gain amplifier 126.

It is the function of first gain correcting PROM 130 that is central to one of the embodiments of the present invention. Basically, the system operates as follows. First autorange control circuit 189, which is responsive to the output signal first buffer amplifier 132, operates via first gain decoding PROM 128 to vary the voltage gain of first variable amplifier 126 in order to maintain the output of first buffer amplifier 132 (and hence the output of first variable gain amplifier 126) within certain predetermined limits. If first autorange control circuit 189 senses that the output voltage amplitude of first buffer amplifier 132 is, for example, too great, first autorange control circuit 189 then operates (via first gain decoding PROM 128) to reduce the voltage gain of first variable-gain amplifier 126 to the next lower voltage gain of a predetermined set of voltage gains. This sequence continues until the amplitude of the output of first buffer amplifier 132 is within the range of acceptable output voltage amplitudes.

Because the actual voltage gain of first variable amplifier 126 will, in general, depart from perfect accuracy, the present invention utilizes first gain correcting PROM 130 to introduce into the system a correction for such departure. In final test of the sampling network analyzer, the departure of the actual voltage gains of first variable-gain amplifier 126 are accurately measured, as a function of the requested or prescribed voltage gain, and digital words representing the departure of actual voltage gain from requested or prescribed voltage gain are programmed into the first gain correcting PROM 130. In this way, when first autorange control circuit 189 commands a particular gain (via first gain decoding PROM 128), the command signal is also applied, as an address, to first gain correcting PROM 130. First gain correcting PROM 130 then provides, to the sampling network analyzer, a data word representing the appropriate gain correction factor. The correction, of course, is unique to the particular sampling network analyzer, or, rather, to the particular first variable gain amplifier 126, and it is the same correction as was measured in final test of that particular sampling network analyzer. Thus, to the extent that voltage gain errors are a consequence of component errors which remain fixed, or at least do not vary substantially after final test of a given system, the data stored in first gain correcting PROM 130 serves to provide an accurate correction to the instrument.

The sampling network analyzer may also be operated in a manual gain control mode, in which first autorange control circuit 189 is inoperative, or rather overridden by the operator. The present invention is equally applicable to that situation, since for any requested or prescribed mid-band voltage gain (whether prescribed by the first autorange control circuit 189 or by the operator of the sampling network analyzer, using front-panel controls), the gain correction factor appropriate to the prescribed mid-band voltage gain is read-out from first gain correcting ROM 130 and made available to the sampling network analyzer.

Typically, the stored correction for mid-band voltage gain is of the following form:

$$1 + 0.004\left[\frac{\epsilon}{128}\right]$$

where

ε = the stored correction factor and eight-bit byte, −127 ≦ ε ≦ 127.

Under these circumstances, the range of correction is approximately ±0.4%, and first gain correcting PROM means must be capable of storing one eight-bit byte for each of the desired, or nominal, mid-band voltage gains.

As previously mentioned, first gain correcting PROM 130 can also be utilized to store, and to provide to the sampling network analyzer, correction factors related to the gain-vs-frequency characteristic of first variable gain amplifier 126. In this situation, the gain-vs-frequency characteristic of first variable gain amplifier 126 is typically modeled as a cascaded two-pole highpass, two-pole lowpass. The correction then takes the form $$1 + \left(\frac{f_L}{f}\right)^2 + \left(\frac{f}{f_H}\right)^2,$$

where $f_L$ = Low-frequency 6-dB response point, measured in final test, and $f_H$ = High-frequency 6-dB response point, measured in final test.

In practice, it is desirable to utilize one 8-bit byte of first gain correcting PROM 130 to represent each of $f_L$, $f_H$. In this case, the actual values of $f_L$ and $f_H$ are conveniently represented by their normalized values, $\epsilon_{fL}$ and $\epsilon_{fH}$, so that $$f_L = 0.2 \text{ Hz } \frac{\epsilon_{fL}}{256}.$$

and $$f_H = 5 \text{ MHz } \frac{\epsilon_{fH}}{256}.$$

In the foregoing, it is assumed that $f_L$ may range up to 0.2 Hz (maximum), and $f_H$ may range up to 5 MHz (maximum), although these data are intended merely to illustrate the application of the invention to one particular sampling network analyzer.

It will be recognized that the sampling network analyzer, in order to utilize the correction factors for the gain-vs-frequency characteristic of first variable gain amplifier 126, must have the capability of measuring or otherwise determining the frequency of the signal applied to, for example, first input port 101. There are, of course, well known techniques for frequency measurement, such as counting an unknown frequency for a known time interval, or counting a known frequency for an interval corresponding to a known number of cycles of the unknown frequency. This latter technique yields a measure of period, which can be mathematically inverted to provide frequency.

As can be seen from FIG. 2, the correction factors stored in first gain correcting PROM 130 are read out onto data bus 106, whereby they are communicated to central processing unit 115 for use in correcting the raw measurements of the sampling network analyzer.

FIG. 2 illustrates an arrangement in which the address bus of first gain correcting PROM 130 is driven by first autorange control circuit 189, so that first gain correcting PROM 130 supplies, to data bus 106, a correction factor appropriate to the selected voltage gain.

In fact, another arrangement is frequently preferable. In this arrangement the correction factors stored in first gain correcting PROM are all sequentially read out to data bus 106 when the sampling network analyzer is first turned on. Central processing unit 115 records the correction factors in a random access memory (RAM), where they remain (and from whence they are summoned, as required) until the sampling network analyzer is turned off. When next turned on, correction factors are once again read from the first gain correcting ROM 130, and stored in RAM.

Second input amplifier 105 is shown, in FIG. 2, in similar detail. Second input amplifier 105 includes second analog input port 102 which is electrically connected to second variable gain amplifier 127. The output of second varible gain amplifier 127 is applied to filtering means 110, and also to the input of second buffer amplifier 133. The output of second buffer amplifier 133 is applied to second absolute value circuit 176 which, along with second diode 177, second peak holding capacitor 178, second reset switch 179, ninth buffer amplifier 180, third Schmitt trigger 181, fourth Schmitt trigger 182, feedback counter 183, second two-wide AND gate 184, third two-wide AND gate 185, second two-wide OR gate 186 and range register 187, constitute second autorange control circuit 190. These enumerated components are, of course, duplicated in first autorange control circuit 189, which was previously discussed in general terms. Now, in connection with the operation of the second channel, the internal functioning of second autorange control circuit 190 will be described.

Second absolute value circuit 176 provides an output that is related to the absolute value of its input, i.e., the output of first buffer amplifier 132. Basically, second absolute value circuit 176 is a full-wave rectifier type circuit. Diode 177 serves to capture into second peak holding capacitor 178, the positive peak of the output of second absolute value circuit 176. Second reset switch 179 operates to discharge, or reset, second peak holding capacitor 178 in response to an external logic signal (designated PDRST in FIG. 2). Ninth buffer amplifier 180, having its input connected to second peak holding capacitor 178, responds to the voltage stored on second peak holding capacitor 178 and provides a low-impedance output signal substantially identical to such voltage. The output of ninth buffer amplifier 180 is applied to one input of third Schmitt trigger 181. The other input of third Schmitt trigger 181 is fed from a threshold voltage, denominated "HIGH" in FIG. 2. When the voltage at the output of ninth buffer amplifier 180 exceeds the reference voltage "HIGH," the output of third Schmitt trigger 181 goes to a logic 1, causing forward-backward counter 183 to increment in a first direction.

Similarly, the output of ninth buffer amplifier 180 is also applied to an input of fourth Schmitt trigger 182. The other input of fourth Schmitt trigger 182 is supplied from a reference voltage designated "LOW" in FIG. 2. When the output voltage from ninth buffer amplifier 180 falls below the reference voltage "LOW," the output of fourth Schmitt trigger 182 assumes a logic 'condition, causing forward-backward counter 183 to decrement, i.e., to count in a direction opposite to that corresponding to a logic 1 from third Schmitt trigger 181. In this way, forward-backward counter 183 is made to count in one direction or another if the output of ninth buffer amplifier 180 is outside voltage limits established by the reference voltages "HIGH" and "LOW."

The output of forward-backward counter 183, which is a parallel digital word, is logically combined, with various other signals not relevant to the present invention, in second two-wide AND gate 184, third two-wide AND gate 185, and second two-wide OR gate 186, and applied to second range register 187. Basically, second range register 187 contains the information that controls the voltage gain of second variable gain amplifier 127 via second gain decoding PROM 129.

It is important to note that the output of range register 187 is also applied, as an address, to second gain correcting PROM 131, in which are stored the correction factors (measured in final test of the particular system) appropriate to second variable-gain amplifier 127. In this way, when range register 187 requests a particular voltage gain of second variable-gain amplifier 127, second gain correcting PROM 131 provides, via data bus 106, a digital word that represents the appropriate correction for gain inaccuracy of second variable-gain amplifier 127 at the particular voltage gain requested. As was discussed in connection with first input amplifier 103, accurate measurements of the midband voltage gain, and low- and high-frequency response characteristics, of second variable gain amplifier 127 are made in final test of the sampling network analyzer and "burned in" or otherwise stored in second gain correcting PROM 131.

The internal details of S-H/MUX/ADC (sample-and-hold, multiplexer and analog-to-digital converter) 113 are shown in FIG. 2.

In particular, third buffer amplifier 134 receives the output of first variable gain amplifier 126, via optional filtering means 110. Similarly, fourth buffer amplifier 135 receives, also via filtering means 110, the output of second variable gain amplifier 127. The output of third buffer amplifier 134 is applied to first sampling gate 136, and thence to first hold capacitor 138. First sampling gate 136 and first hold capacitor 138 constitute a sample-and-hold (S-H) circuit. Fifth buffer amplifier 140, which is electrically connected to first hold capacitor 138, serves to provide a low-impedance output voltage that is substantially equal to the voltage stored on first hold capacitor 138.

In a similar fashion, the output of fourth buffer amplifier 135 is applied, via second sampling gate 137, to second hold capacitor 139. Sixth buffer amplifier 141, having an input which is electrically connected to second hold capacitor 139, serves to provide a low-impedance output voltage that is substantially equal to the voltage stored on second hold capacitor 139.

The outputs of fifth buffer amplifier 140 and sixth buffer amplifier 141 are applied, via first multiplexer switch 142 and second multiplexer switch 143, respectively, to seventh buffer amplifier 144. First multiplexer switch 142, second multiplexer switch 143, and seventh buffer amplifier 144, in combination, constitute an analog multiplexer circuit which serves to select one or the other of the outputs of fifth buffer amplifier 140 and sixth buffer amplifier 141, and present the selected output to the analog-to-digital converter (ADC) 145. ADC 145 operates to convert the analog signal, that is, the output signal of seventh buffer amplifier 144, to a parallel digital signal, which is applied, via bus drivers 146, to the data bus 106.

It is helpful at this point to review the operation of S-H/MUX/ADC 113. Basically, the sample-and-hold portion, comprising first sampling gate 136, first hold capacitor 138, and fifth buffer amplifier 140; and, fourth buffer amplifier 135, second sampling gate 137, second hold capacitor 139, and sixth buffer amplifier 141, operates to sample (simultaneously) the two analog signals presented to the inputs of third buffer amplifier 134 and fourth buffer amplifier 135. These signals are, of course, the outputs of filtering means 110 or, if optional filtering means 110 are not included, then the outputs of first variable gain amplifier 126 and second amplifier 127. In general, in a sampling network analyzer of the type under consideration, it is important that the two signals be sampled simultaneously; time skew between the effective sampling times of the two channels must be minimized.

First multiplexer switch 142, second multiplexer swith 143, and seventh buffer amplifier 144, constitute a two-wide analog multiplexer. This circuit serves to select one of the two outputs of fifth buffer amplifier 140 or sixth buffer amplifier 141 and present the selected output to the analog input of ADC 145. ADC 145 operates to provide a parallel digital signal that is representative of the output of seventh buffer amplifier 144. This digital representation is applied, via bus drivers 146, to data bus 106.

In this way, the two analog input signals, i.e., the signals applied to the input of third buffer amplifier 134 and fourth buffer amplifier 135, are sampled at substantially the same instant, held and then sequentially converted into digital representations which are (sequentially) applied to data bus 106.

In operation of the various components of S-H/MUX/ADC 113 is under the control of ADC control and data memory 114 as can be seen from FIG. 2. The details of the operation of ADC control and data memory 114 will be apparent, from FIG. 2, to one familiar with the art of digital electronic control circuitry. A description of the operation of ADC control and data memory 114 is as follows.

Various trigger signals are logically combined, via three-wide OR gate 147, and applied to the SET input of first SET-RESET flip-flop 148. The Q output of first SET-RESET flip-flop 148 is applied to one input of first two-wide AND gate 149 whose output is, in turn, applied to the SET input of second SET-RESET flip-flop 150. The Q output of second SET-RESET flip-flop 150 serves to operate first sampling gate 136 and second sampling gate 137 in S-H/MUX/ADC 113. It is important to note that the operation of sampling gates 136 and 137 is ultimately synchronized to the logic signal YCRRY, the output of Y counter 163, which is introduced via first two-wide AND gate 149. The Q output of second SET-RESET flip-flop 150 is also applied to the hold input of the first preset counter 151.

As can be seen from FIG. 2, first preset counter 151 is preset with an integer corresponding to the desired number of samples per measurement. The carry output of preset counter 151 is applied to the SET input of third SET-RESET flip-flop 153 and also to the RESET input of first SET-RESET flip-flop 148. ADC memory 155 is controlled by memory control 154 (which also serves to control bus drivers 146 in S-H/MUX/ADC means 113. ADC memory 155 also communicates with data bus 106, under the control of memory control 154.

A logic signal marking the end of channel two conversion is applied to the RESET input of second SET-RESET flip-flop 150 and serves to reset this flip-flop upon the conclusion of the channel two conversion sequence.

Divide-by-two flip-flop 152, having its complementary outputs connected to first multiplexer switch 142 and second multiplexer switch 143, serves to operate these switches alternately so that first one, then the other, of the outputs of fifth buffer amplifier 140 and sixth buffer amplifier 141 are presented to seventh buffer amplifier 144.

Turning now to the detailed illustration in FIG. 2 of the PLL digital circuits 122 and PLL analog circuits 124, it can be seen that external reference frequency input port 123 is electrically connected to an external frequency reference input amplifier 156, whose output is applied, via third multiplexer switch 157, to first Schmitt trigger 159. Also applied, via fourth multiplexer switch 158, to the input of first Schmitt trigger 159, is the output of second buffer amplifier 133 in second input amplifier 105. By actuating one or the other of multiplexer switches 157 and 158, the sampling network analyzer can be synchronized to either an external reference frequency (applied to external reference frequency input port 123), or to the signal applied to the second analog input port 102. The output of first Schmitt trigger 159 is applied to D counter 160, which is a preset counter that is arranged so as to divide by the integer factor D. DCRRY, the carry output of D counter 160, is applied to one input of time difference detector 161. Applied to the other input of time-difference detector 161 is CCRRY, the carry output of C counter 164, which is a preset counter arranged to divide by the integer factor C which is equal to the desired number of samples per measurement (S/M). A voltage reference, generated by first digital-to-analog (DAC) converter means 191, is supplied to time-difference detector 161 in order to program its calibration factor. That is, a given time difference (between corresponding transistions of the logic signals CCRRY and DCRRY, produces output current, from time difference director 161, that is directly proportional to the voltage applied, by first DAC 191, to time-difference detector 161. The output voltage from first DAC 191 is, in turn, controlled by a digital word, designated YC in FIG. 2. In this way, the sampling network analyzer is able to control the gain factor of the phase-locked loop to keep a constant loop gain despite varying synchronization frequencies.

The output of time-difference detector 161 is a current whose duration is equal to the time difference between corresponding transitions of the logic signals CCRRY and DCRRY, and whose amplitude is proportional to the voltage produced by first DAC 191. This current is applied to the summing junction of operational amplifier 165. There is provided an integrating capacitor 166, connected output-to-input of amplifier 165, and first reset switch 167 is connected across integrating capacitor 166 to provide a reset function. The sequence of operation of these components is as follows. First, reset switch 167 closes for a predetermined interval of time to discharge integrating capacitor 166. First reset switch 167 is then opened and the circuit comprising operational amplifier 165 and integrating capacitor 166 functions as a Miller integrator to produce, at the output of operational amplifier 165, a ramp voltage having a slope proportional to the voltage produced by first DAC 191, and a duration related to the time difference between corresponding transitions of the logic signals CCRRY and DCRRY.

Third sampling gate 168, which is electrically connected to the output of operational amplifier 165, then operates to charge third hold capacitor 169 to substantially the same voltage as appears at the output of operational amplifier 165 at the conclusion of the ramp interval. Third sampling gate 168 then opens, so that third hold capacitor 169 retains a charge, and hence a voltage, corresponding to that voltage that existed at the output of operational amplifier 165 at the conclusion of the ramp interval. Eighth buffer amplifier 170 is electrically connected to third hold capacitor 169 in order to provide a low impedance output voltage that is subtantially identical to the voltage stored on third hold capacitor 169. The output voltage of eighth buffer amplifier 170 is applied to the control input of voltage-controlled oscillator 162, which serves to provide, at its output, a logic signal at a frequency that is substantially proportional to the voltage applied to its control input, in other words, to the output voltage of eighth buffer amplifier 170.

It is the output of voltage controlled oscillator 162 that serves as input to Y counter 163. Y counter 163 is a preset counter arranged to divide frequencies by the integer factor Y. YCRRY, output of Y counter 163, serves as input to C counter 164, and it also serves to synchronize the operation of first sampling gate 136 and second sampling gate 137, as can be seen in FIG. 2.

It will be recognized that the various elements recited above constitute a phase-locked loop, in which the output of a voltage-controlled oscillator 162 is divided, first by a factor Y (in Y counter 163), then by a factor C (in C counter 164), and applied to one input of a time difference detector 161. A reference signal is divided by a factor D (in D counter 160) and applied to the other input of time difference detector 161. The output of time difference detector 161 is processed, via a Miller integrator and sample-and-hold, and fed back to control the frequency of voltage-controlled oscillator 162. It will be recognized that this type of loop, when frequency lock is achieved, will produce at the output of C counter 164 a frequency given by:

$$f = \frac{fs}{C} = \frac{fi}{D},$$

where fs is the sampling frequency, that is the frequency of the logic signal YCRRY at the output of Y counter 163; and fi is the frequency of the signal applied to first Schmitt trigger 159, that is, the frequency of the reference signal against which synchronization is to be effected. The sampling frequency fs can thus be seen to be a fraction that is the ratio of two integers (C and D) times the reference frequency fi. In general, the factor C, that is, the factor pre-set into C counter 164, is determined by the desired number of samples per measurement. The factor D, preset into D counter 160, serves merely to divide the reference frequency in those situations where the reference frequency is too high to permit the desired number of samples per measurement within a single period of the reference frequency. In such cases, the desired number of samples per measurement occurs over an integral number of periods of the reference frequency as determined by the factor D.

The Y counter 163 serves a somewhat different function. Basically, Y counter 163 is provided in order to permit limiting the range of frequency that must be provided by voltage-controlled oscillator 162. In other words, depending upon the input frequency F and the desired number of samples per measurement, the factor Y is chosen such that the frequency of voltage-controlled oscillator 162 is within, for example, plus or minus 10% of some nominal center frequency. In this way, the Sampling Network Analyzer can be made to operate over a frequency range spanning many decades, while utilizing a limited-range VCO. The limited range VCO will, in general, provide lower noise than would a wide-range VCO.

It will be recognized that a phase-locked loop, such as described above, will be characterized by an open-loop gain that is related to the frequency of the signals applied to time-difference detector 161, among other variables. First DAC 191 is included in order to counter the effects of this varying open-loop gain. First DAC 191 provides, to time-difference detector 161, a reference voltage that is proportional to the frequency of the phase-locked loop, thus providing more nearly uniform loop dynamics, despite varying reference frequencies.

First absolute value circuit 171, whose input is connected to the output of eighth buffer amplifier 170, serves to provide an output that is related to the absolute value of the instantaneous voltage appearing at the output of eighth buffer amplifier 170. The output of first absolute value circuit 171 is, in turn, applied to one input of second Schmitt trigger circuit 172, the other input of which is supplied a voltage reference. This circuit basically serves to determine whether the output voltage of eighth buffer amplifier 170 is within certain predetermined bounds, thereby indicating whether the phase-locked loop has achieved lock and, if so, whether the lock frequency is within an acceptable range of frequencies for the voltage-controlled oscillator 162. The output of second Schmitt trigger 172 is logically combined, via first two-wide OR gate 173, with the data output of frequency difference detector 175, to produce a logic signal which is supplied to PLL control circuits 174. Basically, the operation of these last-mentioned circuits is to detect an out-of-lock condition and to insure that the phase-locked loop is always operating within an appropriate range of frequencies for the voltage controlled oscillator 162.

It will be understood by those skilled in the art that many modifications and variations of the present invention may be made without departing from the spirit and scope thereof.

What is claimed is:

1. An improved network analyzer of the type having:
   (a) first input port means, the first input port means for receiving a first analog input signal;
   (b) first input amplifier means, electrically connected to the first input port means and responsive to the first analog input signal, the first input amplifier means for producing a first output signal that is related to the first analog input signal, the first input amplifier means characterized by a first midband voltage gain and a first voltage gain-vs.-frequency response;
   (c) first gain control circuit means, electrically connected to the first input amplifier means, the first gain control circuit means for controlling the first midband voltage gain of the first input amplifier means to approximate one of a first set of predetermined midband voltage gains;
   wherein the improvement comprises:
   (d) first midband voltage gain correcting PROM means, connected to the first gain control circuit means, the first gain correcting PROM means for storing correction factors related to discrepancies between actual midband voltage gain of the first input amplifier means and each of the first set of predetermined midband voltage gains.

2. An improved network analyzer as recited in claim 1, wherein the first gain control circuit means comprises first autorange control circuit means for controlling the first midband voltage gain of the first input amplifier means to approximate one of the first set of predetermined midband voltage gains such that amplitude of the first output signal is within a first predetermined range of amplitudes.

3. An improved network analyzer of the type having:
   (a) first input port means, the first input port means for receiving a first analog input signal;
   (b) first input amplifier means, electrically connected to the first input port means and responsive to the first analog input signal, the first input amplifier means for producing a first output signal that is related to the first analog input signal, the first input amplifier means characterized by a first midband voltage gain and a first voltage gain-vs.-frequency response;
   (c) first gain control circuit means, electrically connected to the first input amplifier means, the first gain control circuit means for controlling the first midband voltage gain of the first input amplifier means to approximate one of a first set of predetermined midband voltage gains;
   (d) central processor unit means, for controlling, and for interpreting data produced by, various subsystems of the sampling network analyzer;
   (e) data bus means, electrically connected to the central processor unit means and to the various subsystems of the sampling network analyzer, the data bus means for communicating between the central processor unit means and the various subsystems of the sampling network analyzer;
   wherein the improvement comprises:
   (f) first midband voltage gain correcting PROM means, electrically connected to the data bus means, the first midband gain correcting PROM means for storing correction factors related to discrepancies between actual midband voltage gain of the first input amplifier means and each of the first set of predetermined midband voltage gains.

4. An improved network analyzer as recited in claim 3, wherein the first gain control circuit means comprises first autorange control circuit means for controlling the first midband voltage gain of the first input amplifier means to approximate one of the first set of predetermined midband voltage gains such that amplitude of the first output signal is within a first predetermined range of amplitudes.

5. An improved network analyzer of the type having:
   (a) first input port means, the first input port means for receiving a first analog input signal;
   (b) first input amplifier means, electrically connected to the first input port means and responsive to the first analog input signal, the first input amplifier means for producing a first output signal that is related to the first analog input signal, the first input amplifier means characterized by a first midband voltage gain and a first voltage gain-vs.-frequency response;
   (c) central processor unit means, for controlling, and for interpreting data produced by, various subsystems of the sampling network analyzer;

(d) data bus means, electrically connected to the central processor unit means and to the various subsystems of the sampling network analyzer, the data bus means for communicating between the central processor unit and the various subsystems of the sampling network analyzer;

wherein the improvement comprises:

(e) first frequency-response correcting PROM means, electrically connected to the data bus means, the first frequency correcting PROM means for storing correction factors related to the first voltage gain-vs.-frequency response of the first input amplifier means.

6. An improved network analyzer of the type having:

(a) first input port means, the first input port means for receiving a first analog input signal;

(b) first input amplifier means, electrically connected to the first input port means and responsive to the first analog input signal, the first input amplifier means for producing a first output signal that is related to the first analog input signal, the first input amplifier means characterized by a first midband voltage gain and a first voltage gain-vs.-frequency response;

(c) first gain control circuit means, electrically connected to the first input amplifier means, the first gain control circuit means for controlling the first midband voltage gain of the first input amplifier means to approximate one of a first set of predetermined midband voltage gains;

(d) central processor unit means, for controlling, and for interpreting data produced by, various subsystems of the sampling network analyzer;

(e) data bus means, electrically connected to the central processor unit means and to the various subsystems of the sampling network analyzer, the data bus means for communicating between the central processor unit and the various subsystems of the sampling network analyzer;

wherein the improvement comprises:

(f) first frequency-response correcting PROM means, electrically connected to the data bus means, the first frequency correcting PROM means for storing correction factors related to the first voltage gain-vs.-frequency response of the first input amplifier means.

7. An improved network analyzer as recited in claim 6, wherein the first gain control circuit means comprises first autorange control circuit means for controlling the first midband voltage gain of the first input amplifier means to approximate one of the first set of predetermined midband voltage gains such that amplitude of the first output signal is within a first predetermined range of amplitudes.

* * * * *